(12) United States Patent
Yen

(10) Patent No.: US 11,521,975 B2
(45) Date of Patent: Dec. 6, 2022

(54) SEMICONDUCTOR MEMORY STRUCTURE AND METHOD FOR FORMING THE SAME

(71) Applicant: WINBOND ELECTRONICS CORP., Taichung (TW)

(72) Inventor: Ying-Chu Yen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/244,438

(22) Filed: Apr. 29, 2021

(65) Prior Publication Data

US 2021/0366911 A1 Nov. 25, 2021

(30) Foreign Application Priority Data

May 20, 2020 (TW) .................................. 109116707

(51) Int. Cl.
*H01L 27/108* (2006.01)
*H01L 29/78* (2006.01)
*H01L 21/768* (2006.01)
*H01L 29/66* (2006.01)

(52) U.S. Cl.
CPC .. *H01L 27/10814* (2013.01); *H01L 21/76897* (2013.01); *H01L 27/10855* (2013.01); *H01L 27/10873* (2013.01); *H01L 27/10885* (2013.01); *H01L 27/10888* (2013.01); *H01L 29/66666* (2013.01); *H01L 29/7827* (2013.01)

(58) Field of Classification Search
None
See application file for complete search history.

(56) References Cited

U.S. PATENT DOCUMENTS 6,624,033 B2 9/2003 Noble
2018/0069117 A1* 3/2018 Cho .................. H01L 27/10876

FOREIGN PATENT DOCUMENTS

TW I368315 B 7/2012

* cited by examiner

*Primary Examiner* — Anthony Ho
*Assistant Examiner* — Kevin Quinto
(74) *Attorney, Agent, or Firm* — Muncy, Geissler, Olds & Lowe, P.C.

(57) ABSTRACT

A method for forming a semiconductor memory structure includes forming an isolation structure surrounding an active region in a substrate. The method also includes forming a first trench to separate the active region into a first active region and a second active region. The method also includes forming a bit line over the bottom portion of the first trench. The method also includes forming a word line surrounding the first active region and the second active region and over the bit line. The method also includes self-aligned forming a contact over the first active region and the second active region. The method also includes forming a capacitor over the contact.

20 Claims, 17 Drawing Sheets

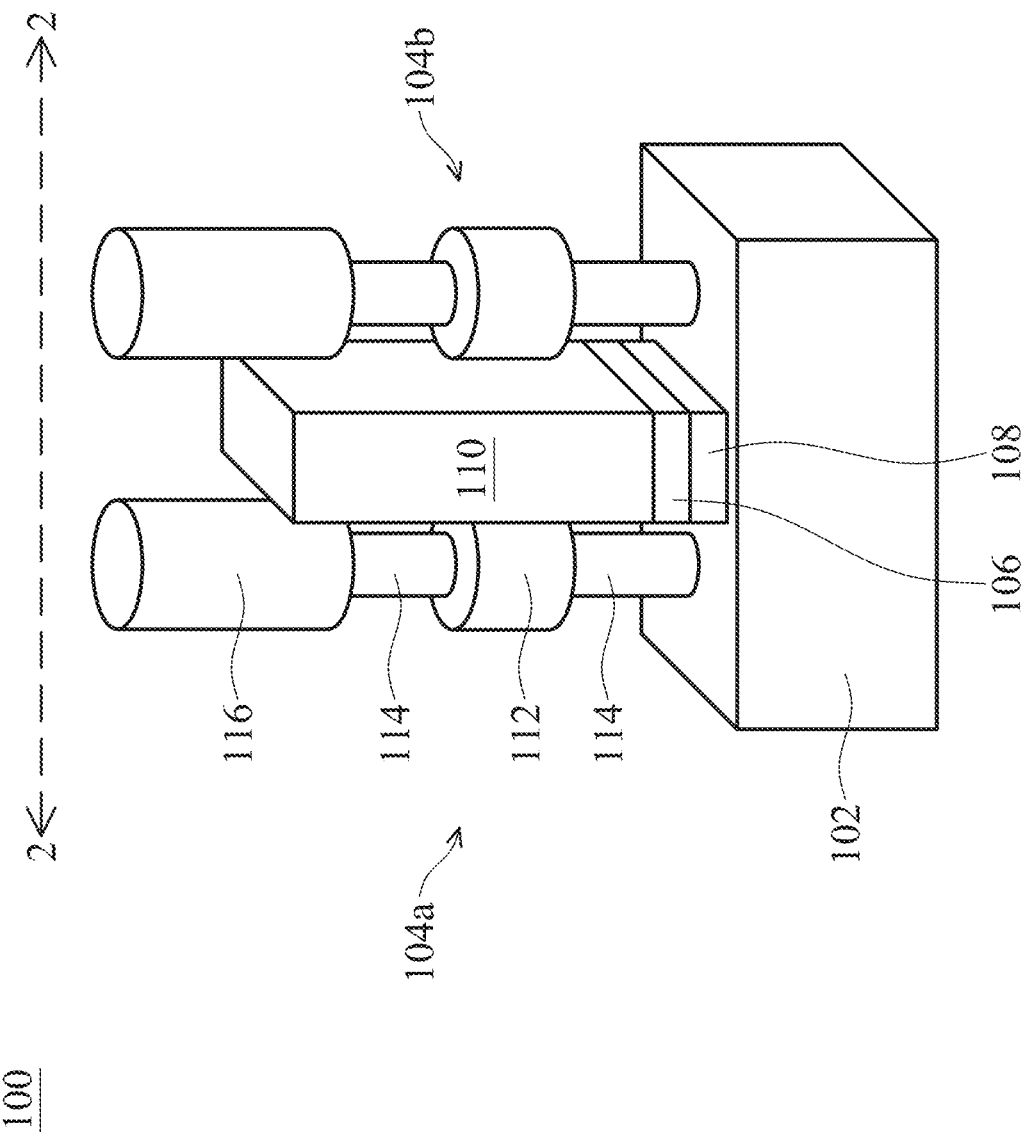

SEMICONDUCTOR MEMORY STRUCTURE AND METHOD FOR FORMING THE SAME

BACKGROUND

CROSS REFERENCE TO RELATED APPLICATIONS

This application claims the benefit of Taiwan Patent Application No. 109116707 filed on May 20, 2020, entitled "SEMICONDUCTOR MEMORY STRUCTURE AND METHOD FOR FORMING THE SAME" which is hereby incorporated herein by reference.

TECHNICAL FIELD

The disclosure relates to a semiconductor structure and more particularly to a Gate-all-around (GAA) structure and method for forming the same.

DESCRIPTION OF THE RELATED ART

The semiconductor integrated circuit industry has experienced rapid growth. The development of integrated circuit design and materials technologies has produced generations of integrated circuits. Each of these generations has produced smaller and more complex circuits than the previous generation. In the progress of integrated circuit development, geometric size has gradually reduced.

As the size of integrated circuits shrunk, the density of Dynamic Random Access Memory (DRAM) has increased, and the sub-threshold leakage, the gate-induced drain leakage (GIDL), and the leakage current between the word line and the word line may increase, causing a loss of retention time.

Although existing Dynamic Random Access Memory has generally been adequate for its intended purposes, it has not been entirely satisfactory in all respects. For example, the loss in retention time caused by leakage current still needs to be fixed.

BRIEF SUMMARY

A method for forming a semiconductor memory structure includes forming an isolation structure surrounding an active region in a substrate. The method also includes forming a first trench to separate the active region into a first active region and a second active region. The method also includes forming a bit line over the bottom portion of the first trench. The method also includes forming a word line surrounding the first active region and the second active region and over the bit line. The method also includes forming a contact over the first active region and the second active region by a self-aligned deposition process. The method also includes forming a capacitor over the contact.

A semiconductor memory structure includes an isolation structure surrounding the first active region and the second active region disposed over a substrate. The structure also includes a bit line disposed below the isolation structure between the first active region and the second active region. The structure also includes a word line surrounding the first active region and the second active region and disposed over the bit line. The structure also includes a contact disposed over the first active region and the second active region and direct contact with the first active region and the second active region. The structure also includes a capacitor disposed over the contact.

A detailed description is given in the following embodiments with reference to the accompanying drawings.

BRIEF DESCRIPTION OF DRAWINGS

FIG. 1 is a perspective view of a semiconductor memory structure in accordance with some embodiments.

FIGS. 2A-2G, 2H-1, 2I-2L, and 2M-1 are cross-sectional representations of various stages of forming a semiconductor memory structure in accordance with some embodiments.

FIGS. 2H-2 and 2M-2 are top views of a semiconductor memory structure in accordance with some embodiments.

DETAILED DESCRIPTION

The embodiments of the present disclosure provide a method of forming a Dynamic Random Access Memory with a buried bit line. This structure may block leakage current between the word lines. The Gate-all-around structure may reduce the sub-threshold leakage current caused by short channel effect, and the gate not being overlapped with the source/drain region may also reduce the gate-induced drain leakage (GIDL) current. A well region is formed under the bit line, which may reduce the leakage current between the bit lines. Moreover, the contact over the active region is formed by self-aligned, which may reduce the number of masks and the process. The capacitor that is formed is arranged in a honeycomb shape, which may increase the memory density.

Figure 2A:
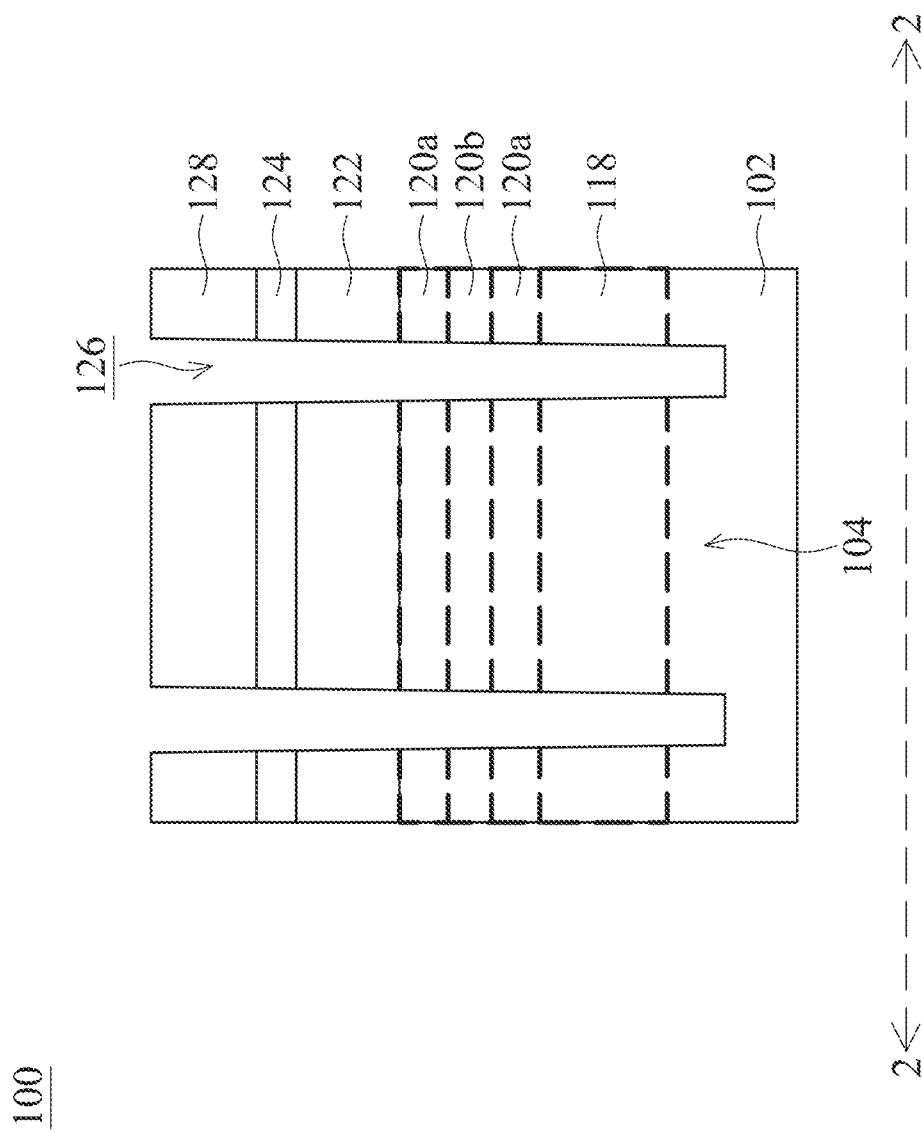
Figure 2B:
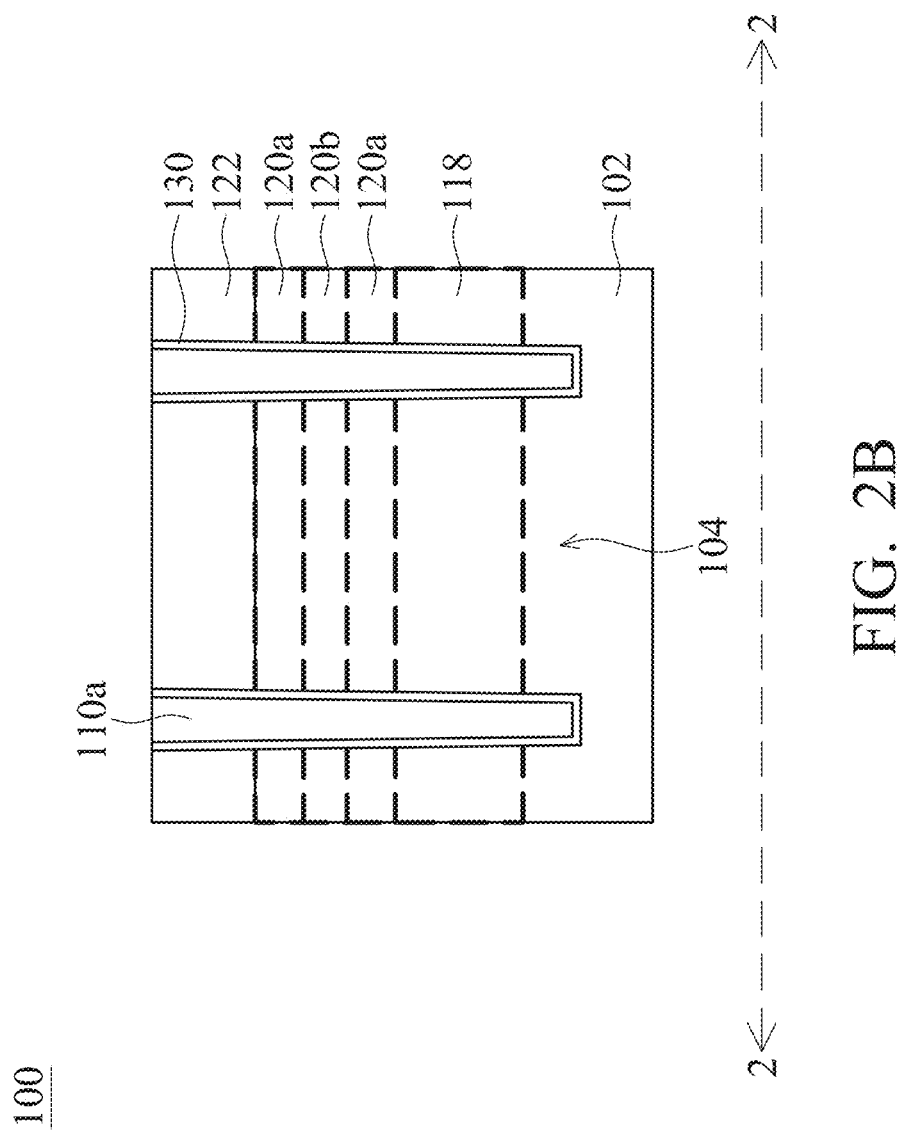
Figure 2C:
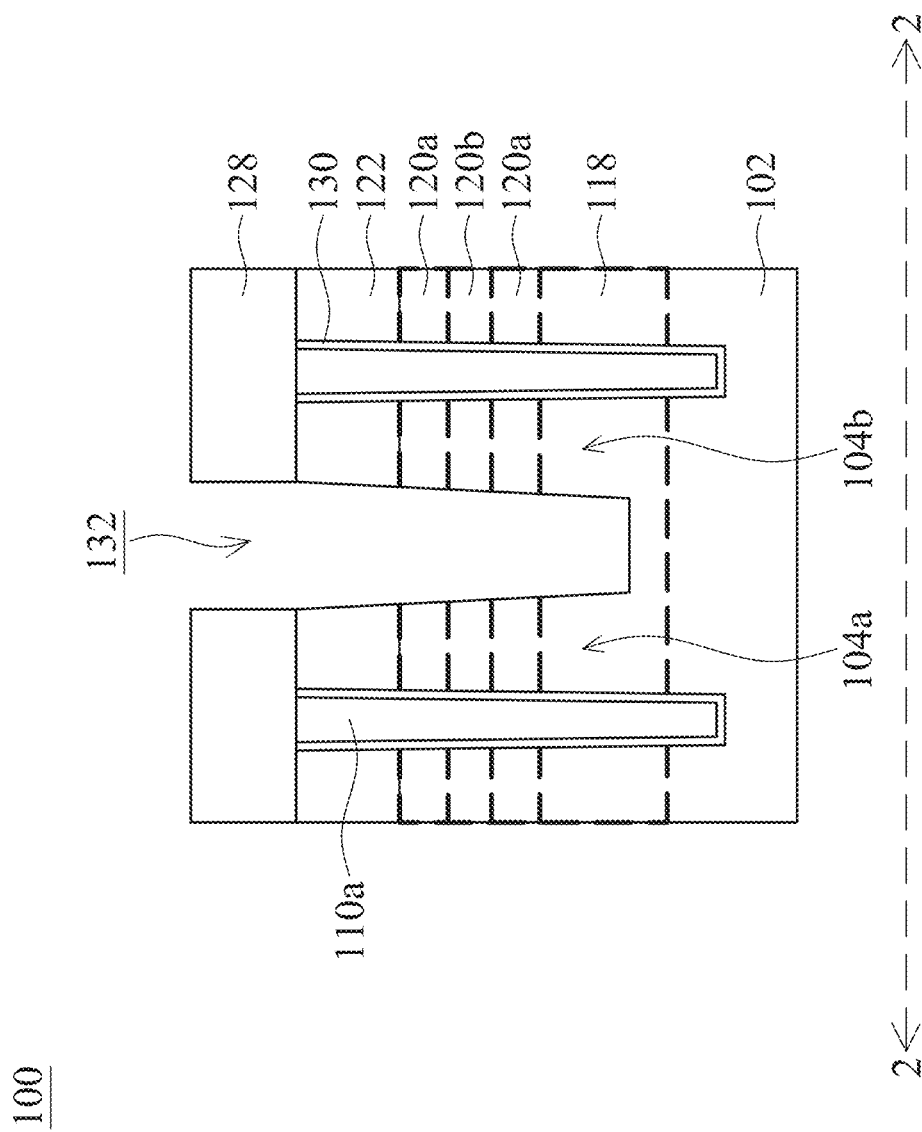
Figure 2D:
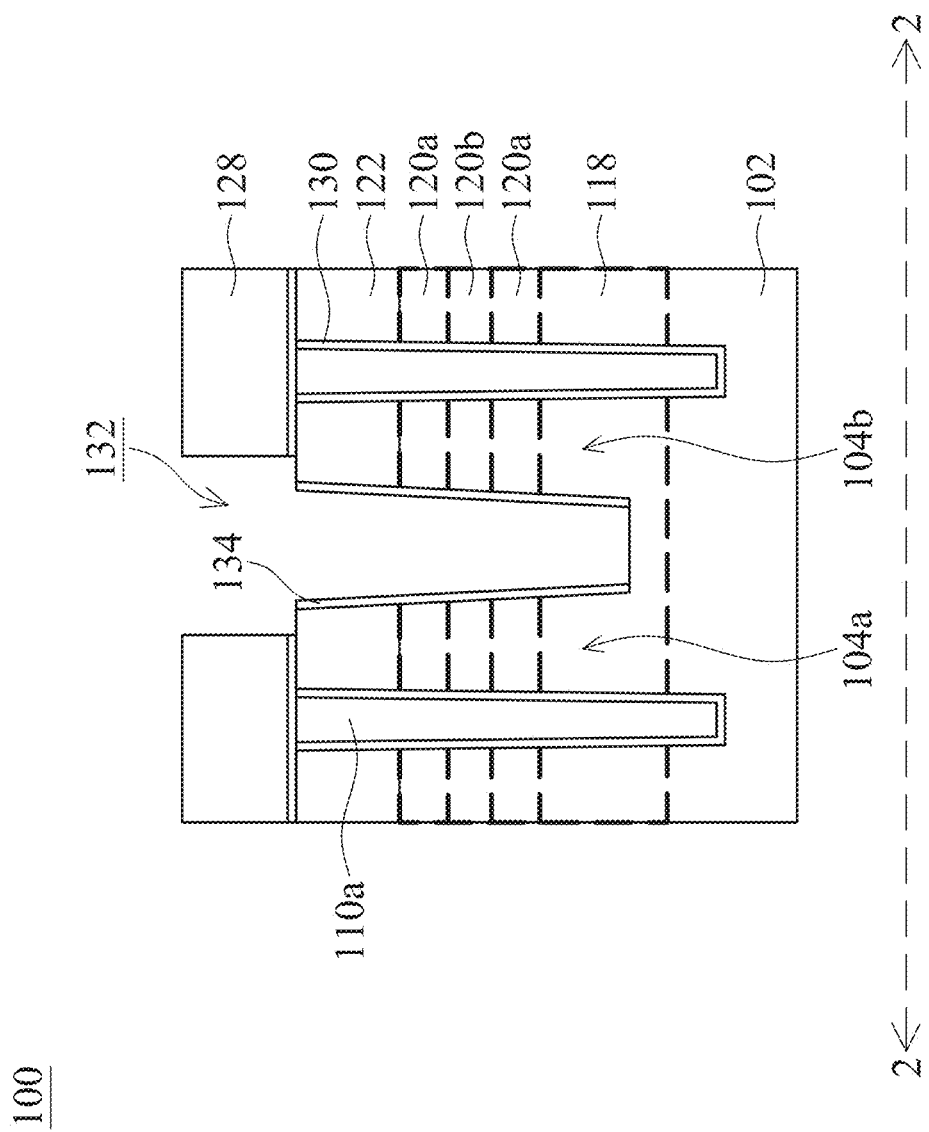
Figure 2E:
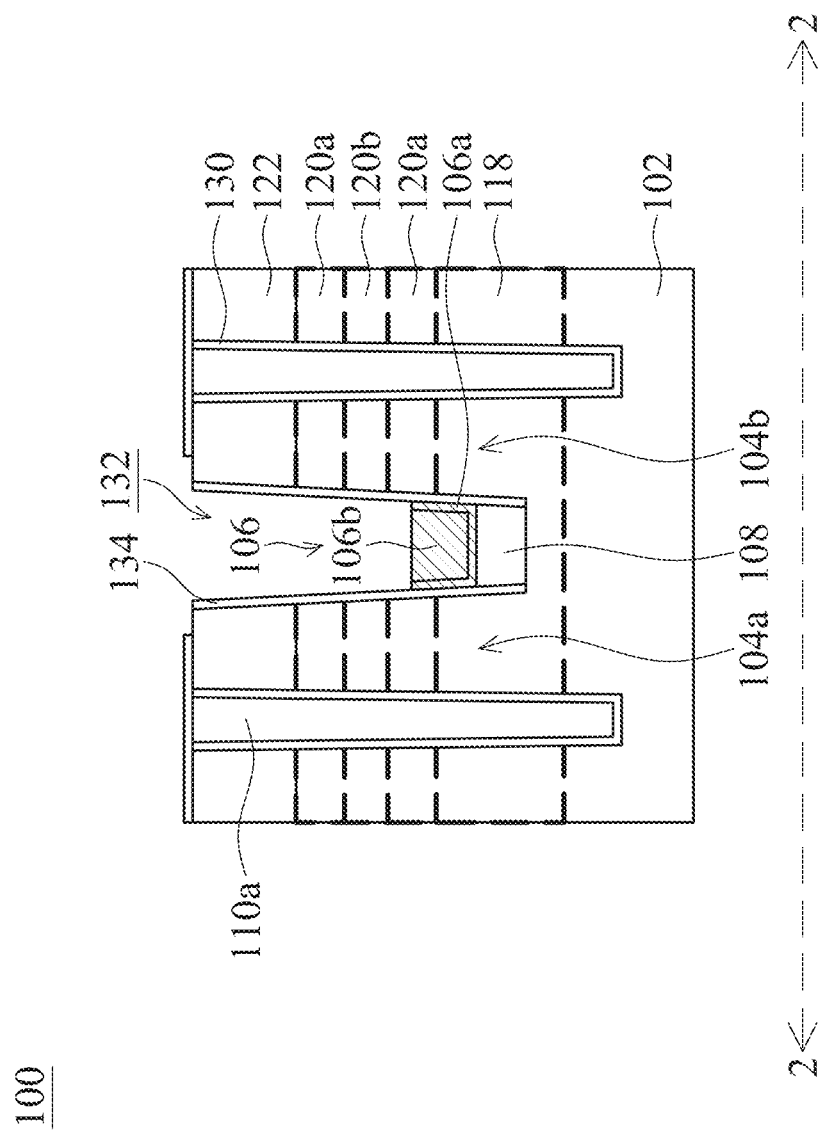
Figure 2F:
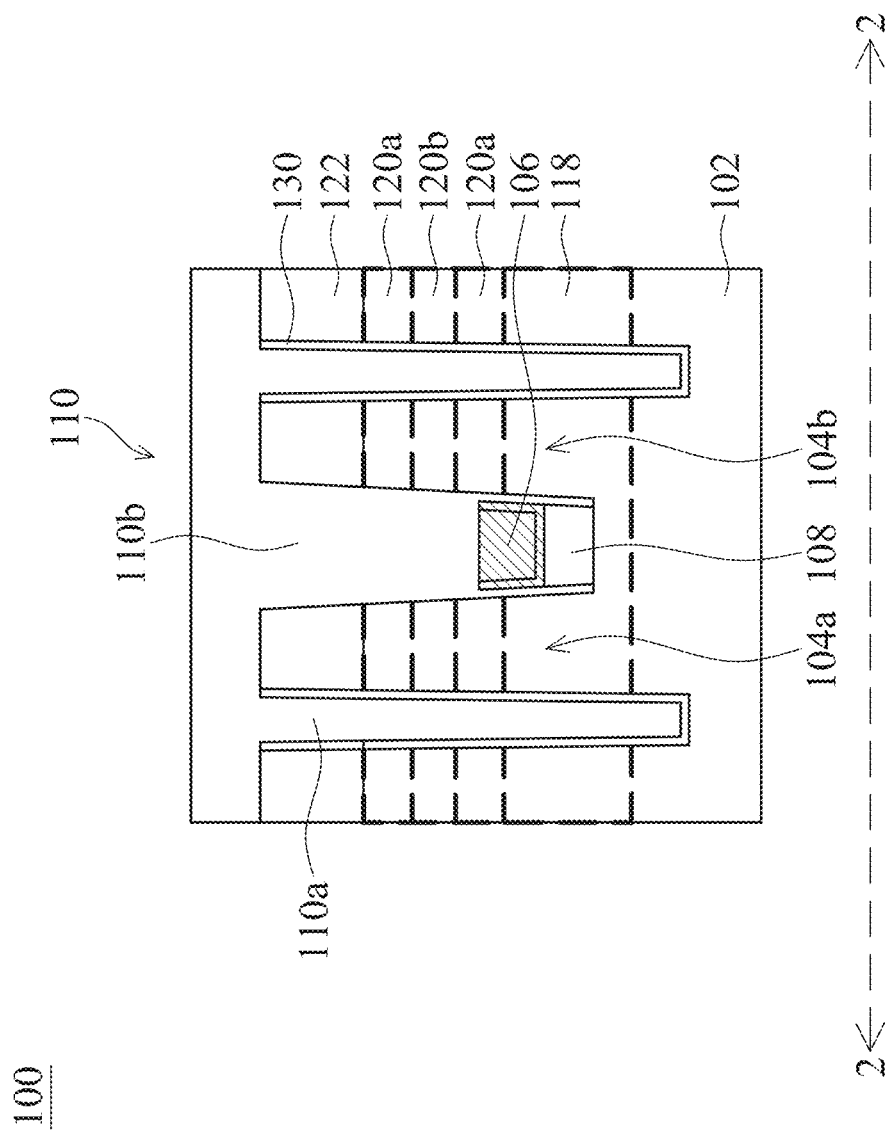
Figure 2G:
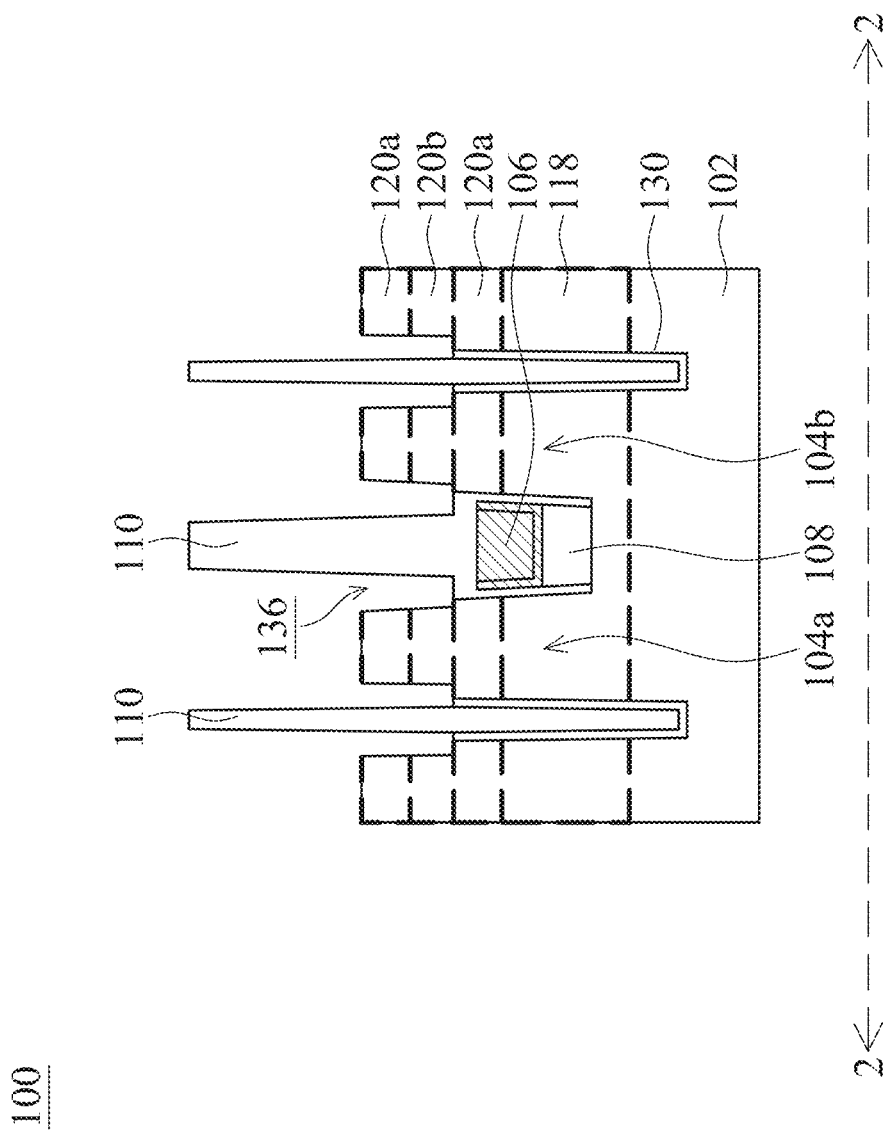
Figures 1, 2H:
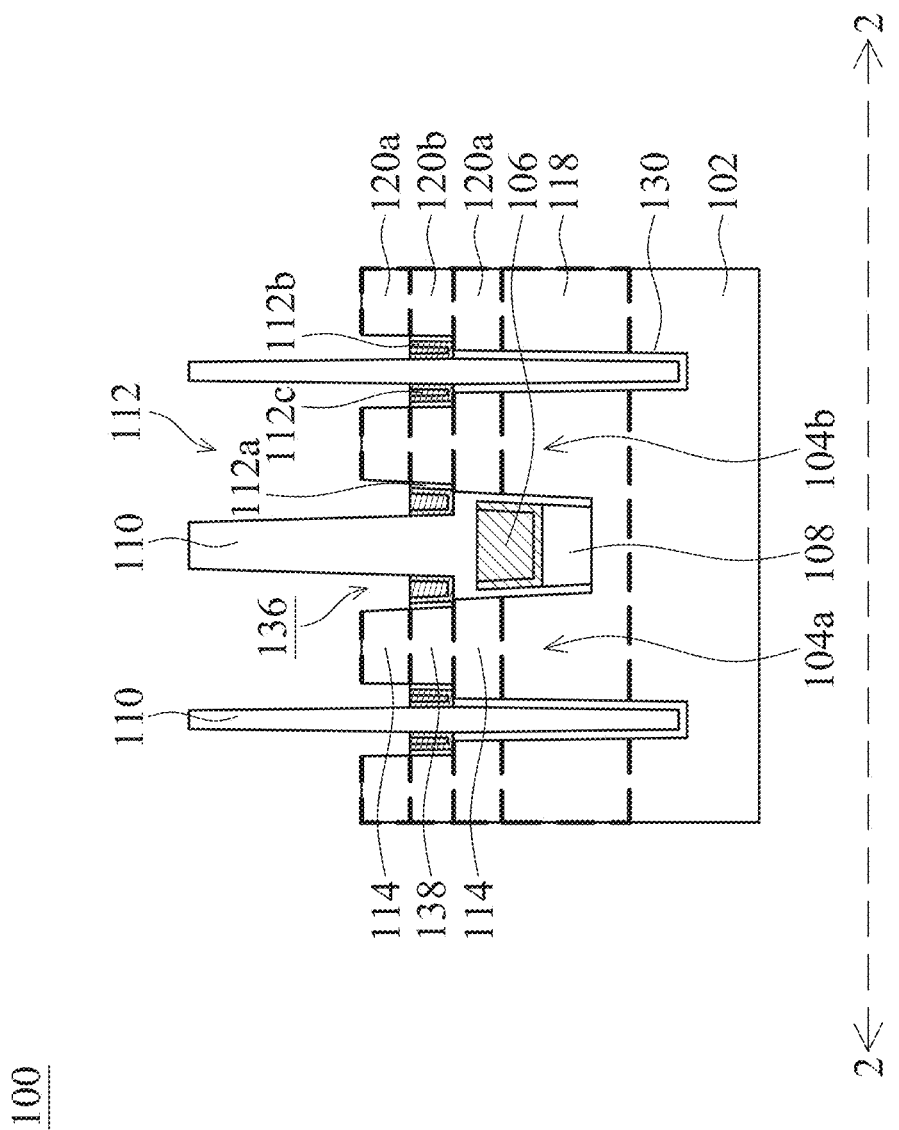

FIG. 1 is a perspective view of a semiconductor memory structure 100 in accordance with some embodiments. FIGS. 2A-2G, 2H-1, 2I-2L, and 2M-1 are cross-sectional representations of various stages of forming a semiconductor memory structure 100 in accordance with some embodiments. FIGS. 2A-2G, 2H-1, 2I-2L, and 2M-1 show cross-sectional representations of semiconductor memory structure 100 taken along line 2-2 in FIG. 1. As shown in FIG. 1, the semiconductor memory structure 100 includes the substrate 102 with the first active region 104a and the second active region 104b formed thereon. The bit line 106 is buried between the first active region 104a and the second active region 104b, which is connected to the substrate 102 by underlying semiconductor layer 108, and the isolation material 110 separates the first active region 104a and the second active region 104b thereon. The word line 112 surrounds the first active region 104a and the second active region 104b to form a Gate-all-around structure, and the source/drain regions 114 are disposed above and below the word line 112 respectively. The capacitor 116 is formed over the first active region 104a and the second active region 104b.

As shown in FIGS. 1 and 2A, a substrate 102 is provided. The substrate 102 may be a semiconductor substrate As shown in FIG. 2A according to some embodiments, the substrate 102 is blanketly doped. A well region 118 with a first conductivity type is formed in the substrate 102. A first dopant region 120a with the first conductivity type and a second dopant region 120b with a second conductivity type are formed over the well region 118, and the first conductivity type is different from the second conductivity type. In some embodiments, the second dopant region 120b is located between two first dopant regions 120a. In some embodiments, the first conductivity type is N-type. In some embodiments, the first conductivity type is P-type. The N-type dopant may include P, As, N, Sb ions, or a combination thereof. The P-type dopant may include B, Ga, Al, In, $BF_3^+$ ions, or a combination thereof.

Next, as shown in FIG. 2A, a top layer 122 is formed over the substrate 102, and a pad layer 124 is formed over the top layer 122. The top layer 122 may be a buffer layer between the substrate 102 and the pad layer 124. The pad layer 124 may be an etch stop layer for subsequently planarization process. In some embodiments, the top layer 122 may be oxide such as silicon oxide. The pad layer 124 may be SiN, SiCN, SiOC, SiOCN, other applicable material, or a combination thereof. SiN may isolate and may be the etch stop layer for subsequently etching. The top layer 122 and the pad layer 124 may be formed by a deposition process, a spin-on coating process, a sputtering process, or a combination thereof.

Next, as shown in FIG. 2A, a trench 126 is formed to define an active region 104 by a patterning process such as a photolithography and an etching process. In some embodiments, the trench 126 surrounds the active region 104. The patterning process may include photoresist 128 coating (such as spin-on coating), soft baking, mask alignment, pattern exposure, post-exposure baking, the photoresist 128 development, rinsing and drying (such as hard baking), other applicable techniques, or a combination thereof.

In some embodiments, the well region 118 is located in the substrate 102 at the lower portion of the active region 104. In some embodiments, the bottom surface of the trench 126 protrudes lower than a lower surface of the well region 118.

Next, as shown in FIG. 2B, a liner layer 130 is conformally formed at the sidewall and the bottom surface of the trench 126. The liner layer 130 may protect the active region 104 to prevent it from damage in the subsequently process (such as in the anneal or etching process). In some embodiments, the liner layer 130 is made of oxide such as silicon oxide.

Next, as shown in FIG. 2B, an isolation structure 110a is formed in the trench 126. The isolation structure 110a may be formed by silicon nitride, silicon oxide, other dielectric materials, or a combination thereof. In some embodiments, the isolation structures 110a in different regions of the substrate 102 are made of different materials. For example, trenches 126 with different area size in the substrate 102 are filled by different isolation structure materials. Afterwards, the isolation structure 110a is planarized to expose a top surface of the pad layer 124 (not shown). The isolation structure 110a may be planarized by a chemical mechanical polishing (CMP) process.

Next, as shown in FIG. 2B, the pad layer 124 is removed. In some embodiments, the pad layer 124 is removed by a wet etching process or a dry etching process.

Next, as shown in FIG. 2C, a trench 132 is formed in the active region 104 by the patterning process and the etching process. In some embodiments, the trench 132 separates the active region 104 into a first active region 104a and a second active region 104b. The bottom surface of the trench 132 is located in the well region 118. The process of forming the trench 132 is similar or the same as the process of forming the trench 126, and is not repeated herein.

Next, as shown in FIG. 2D, a barrier layer 134 is conformally formed over the sidewalls and the bottom surface of the trench 132, the top surface of the top layer 122, and the top surface of the isolation structure 110a. In some embodiments, the barrier layer 134 is made of nitride such as SiN, SiCN, SiOC, SiOCN. SiN may be a barrier layer of the metal such as tungsten in the subsequently formed bit lines. In some embodiments, the barrier layer 134 and the isolation structure 110a are made of the same material. Next, the barrier layer 134 over the bottom surface of the trench 132 and the barrier layer 134 over the top surface of portion of the top layer 122 are removed by the patterning process such as photolithography and etching process to expose the substrate 102 at the bottom portion of the trench 132 and a portion of the top layer 122.

Next, as shown in FIG. 2E, a semiconductor material layer 108 is deposited at the bottom of the trench 132. In some embodiments, the bottom portion of the semiconductor material layer 108 is located in the well region 118. In some embodiments, the semiconductor material layer 108 includes polysilicon. Polysilicon and Ti in the subsequently formed bit lines may form titanium silicide in order to reduce resistance. Afterwards, an etching process may be performed to etch-back the semiconductor material layer 108 to a desired height.

Afterwards, as shown in FIG. 2E according to some embodiments, a bit line 106 is formed over the semiconductor material layer 108 in the trench 132. In some embodiments, the bit line 106 and the semiconductor material layer 108 are at the bottom of the trench 132. In some embodiments, the bit line 106 includes a barrier layer 106a and a conductive layer 106b. Before forming the conductive layer 106b, the barrier layer 106a may be formed at the sidewall and the bottom portion of the trench 132 in order to prevent the conductive material from diffusing to the first active region 104a and the second active region 104b. The material of the barrier layer 106a may be Ti, TiN, Ta, TaN, W, WN, other suitable materials, or a combination thereof. The conductive layer 106b includes metal material (such as tungsten, aluminum, or copper), metal alloy, other suitable material, or a combination thereof.

Next, an etching process is performed to etch back the conductive layer 106b and the barrier layer 106a to a desired height to form the bit line 106. In some embodiments, a top surface of the bit line 106 is lower than a top surface of the lower first dopant region 120a. In some embodiments, the semiconductor material layer 108 is between the well region 118 and the bit line 106, and is located in direct contact with the well region 118 and the bit line 106.

In some embodiments, a portion of the well region 118 is below the bit line 106, and a bottom portion of the semiconductor layer 108 below the bit line 106 is located in the well region 118. Therefore, the well region 118 and the isolation structure 110a may reduce the leakage current between adjacent bit lines 106.

Next, as shown in FIG. 2F, the trench 132 is filled with the isolation material 110b. Therefore, the bit line 106 is below the isolation material 110b. In some embodiments, the isolation material 110b and the isolation material 110a are made of the same material. Therefore, the isolation material 110b and the isolation material 110a may be regarded as the same isolation structure 110, which surrounds the first active region 104a and the second active region 104b. In some embodiments, the isolation material 110b and the isolation material 110a includes nitride such as SiN, SiCN, SiOC, SiOCN. SiN may be a barrier layer of metal such as tungsten in the bit line 106. The process of filling the isolation material 110b is similar or the same as the process of the isolation structure 110a, and is not repeated herein.

Next, as shown in FIG. 2G, the word line 112 is formed by the patterning process such as photolithography and etching process. First, the etching process is performed to remove the isolation material 110b over the top layer 122 and the top layer 122. A portion of the isolation structure 110 over the sidewalls of the first active region 104a and the second active region 104b is further etched, such that a trench 136 is formed between the first active region 104a, the second active region 104b, and the isolation structure 110. In some embodiments, the trench 136 surrounds the first active region 104a and the second active region 104b. In some embodiments as shown in FIG. 2G, the bottom portion of the trench 136 is level with the bottom portion of the second doped region 102b, and the isolation structure 110 protrude over the top surface of the first active region 104a and the second active region 104b. The trench 136 may be formed by etching process such as a wet etching process, a dry etching process, other suitable techniques, or a combination thereof.

Next, as shown in FIG. 2H-1, the word line 112 is formed in the trench 136. In some embodiments, the word line 112 includes the gate dielectric layer 112a, the barrier layer 112b, and the conductive layer 112c. Among them, the gate dielectric layer 112a is over a portion of the sidewall of the first active region 104a and the second active region 104b. The barrier layer 112b is conformally formed over the surface of first active region 104a, the second active region 104b, and the isolation structure 110 in the trench 136, and the space between the barrier layers 112b in the trench 136 is filled with the conductive layer 112c. In some embodiments as shown in FIG. 2H-1, the word line 112 is over the buried bit line 106.

In some embodiments, the gate dielectric layer 112a may include silicon oxide, silicon nitride, or silicon oxynitride, high dielectric constant (high-k) (i.e., dielectric constant greater than 3.9) dielectric material such as $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, or a combination thereof. The process of forming the barrier layer 112b and the conductive layer 112c of the word line 112 may be similar or the same as the process of forming the barrier layer 106a and the conductive layer 106b of the bit line 106, and is not repeated herein.

Figures 2, 2H:
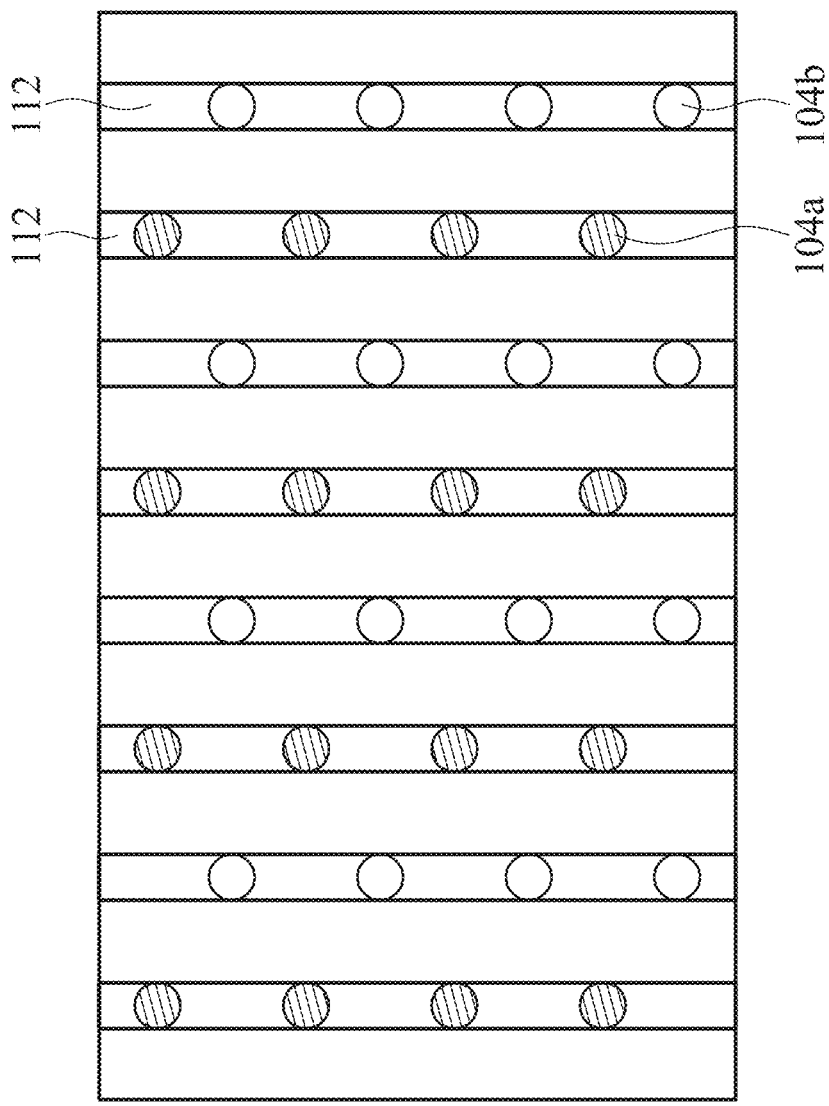

FIG. 2H-2 is a top view of the semiconductor memory structure 100 in the FIG. 2H-1. As shown in FIG. 2H-2, the word line 112 surrounds the first active region 104a and the second active region 104b to form a Gate-all-around structure. In this way, the contact area of the word line 112 and the channel region has increased, and the sub-threshold leakage current caused by the short-channel effect has decreased.

It should be noted that, for distinguishing, the first active region 104a and the second active region 104b are drawn in different styles. However, the structures and the materials of the first active region 104a and the second active region 104b are the same.

After filling the conductive layer 112c, an etching process is performed to etch back the gate dielectric layer 112a, the barrier layer 112b, and the conductive layer 112c to expose the top portion of the first active region 104a and the second active region 104b, in accordance with some embodiments as shown in FIG. 2H-1. As shown in FIG. 2H-1, the top surface and the bottom surface of the word line 112 are respectively at the same level with the top surface and the bottom surface of the second dopant region 120b. Therefore, a channel region 138, which has a second conductivity type, is formed in the first active region 104a and the second active region 104b surrounded by the word line 112. The first active region 104a and the second active region 104b exposed from the word line 112 above or below the channel region 138 forms the source/drain region 114, which is located in the range of the first dopant region 120a and has a first conductivity type. Since the word line 112 does not overlap with the source/drain region 114, therefore the gate-induced drain leakage (GIDL) may be reduced. In addition, since the bit line 106 is buried below the isolation structure 110 between the word lines 112, adjacent word lines 112 are separated by the isolation structure 110. Therefore, the leakage current between the word lines 112 may be reduced.

Figure 2I:
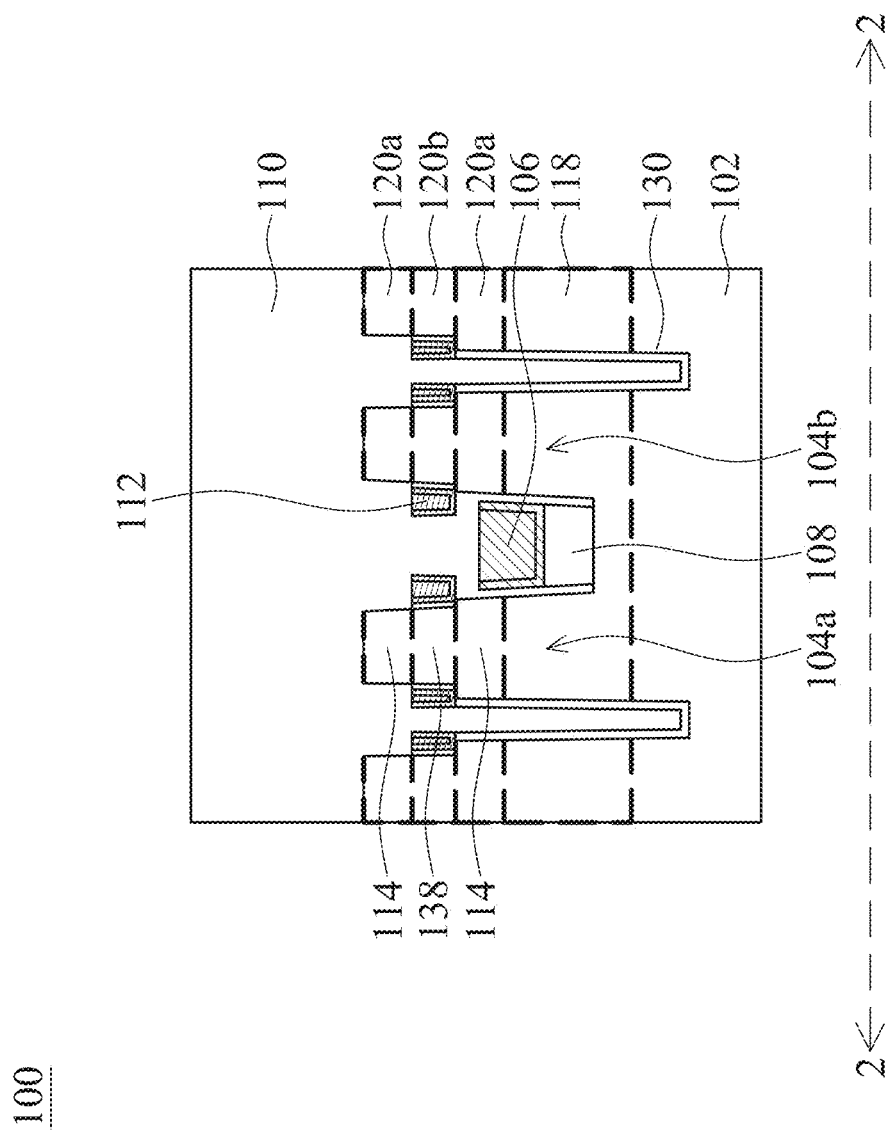
Figure 2J:
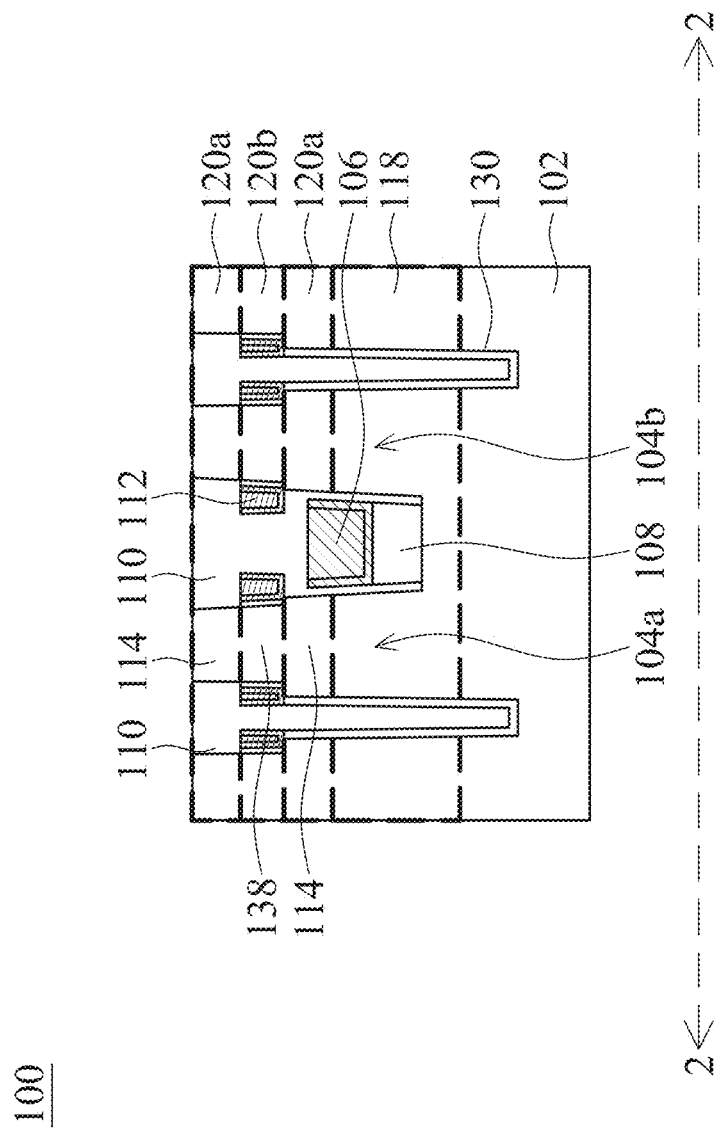

Next, as shown in FIGS. 2I-2J, the trench 136 is filled with the isolation material 110, and a planarization process such as a chemical mechanical polishing (CMP) process is performed to etch isolation material 110 to expose the top surface of the first active region 104a and the second active region 104b.

Figure 2K:
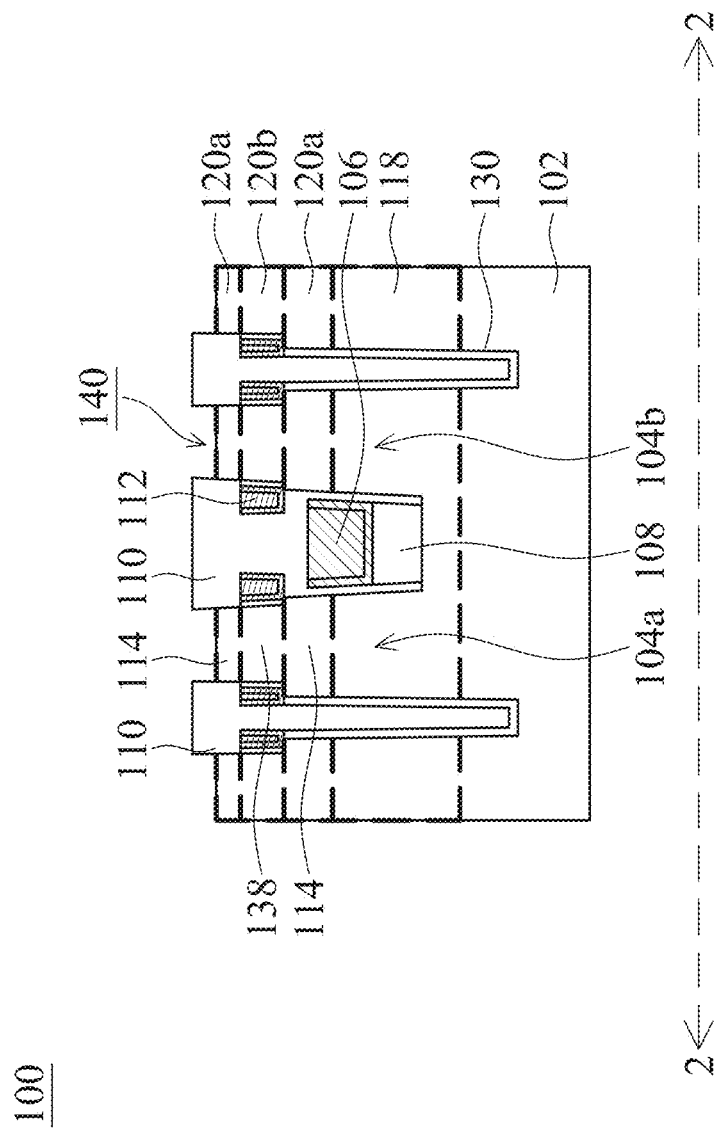

Afterwards, as shown in FIG. 2K, the top portion of the first active region 104a and the second active region 104b is etched back by an etching process to form a recess 140.

Next, a metal semiconductor compound layer is selectively formed at the top portion of the first active region 104a and the second active region 104b (not shown). The metal semiconductor compound layer may lower the resistance between the source/drain region 114 and the subsequently formed contact. The metal semiconductor compound layer may include $TiSi_2$, NiSi, Cosi, other suitable materials, or a combination thereof. A metal layer may be formed over the source/drain region 114 first, and then an anneal process make the metal layer react with the source/drain region 114 to produce the metal semiconductor compound layer. Thereafter, the unreacted metal layer is removed by an etching process, and the metal semiconductor compound layer remains.

Figure 2L:
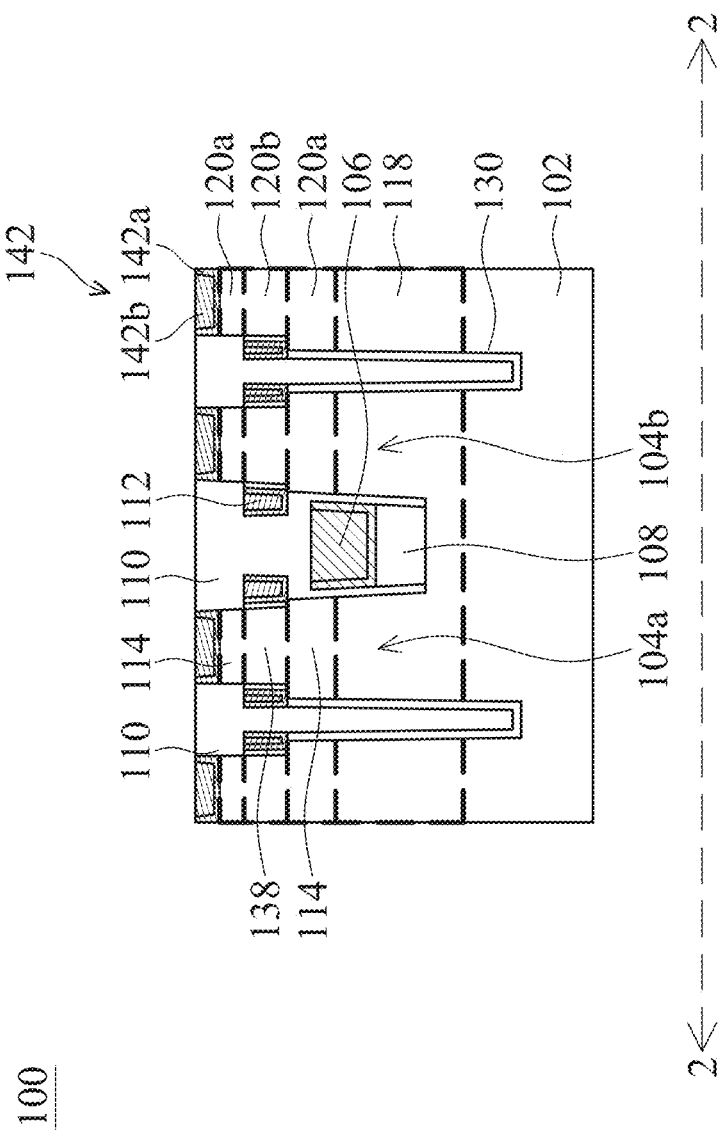

Afterwards, as shown in FIG. 2L, the contact 142 is formed in the recess 142. In some embodiments, the contact 142 includes a barrier layer 142a and a conductive material 142b. As shown in FIG. 2L, the bottom surface of the contact 142 is lower than the top surface of the isolation structure 110. In some embodiments, the contact 142 is over the first active region 104a and the second active region 104b, and is in direct contact with the source/drain region 114 of the first active region 104a and the second active region 104b.

The material and the process of forming the barrier layer 142a and a conductive material 142b is similar or the same as material and the process of forming the barrier layer 106a and the conductive layer 106b, and are not repeated herein. By using the method illustrated in FIGS. 2K-2L, the contact 142 may be self-aligned formed over the first active region 104a and the second active region 104b and does not need an extra mask and patterning process.

Figures 1, 2M:
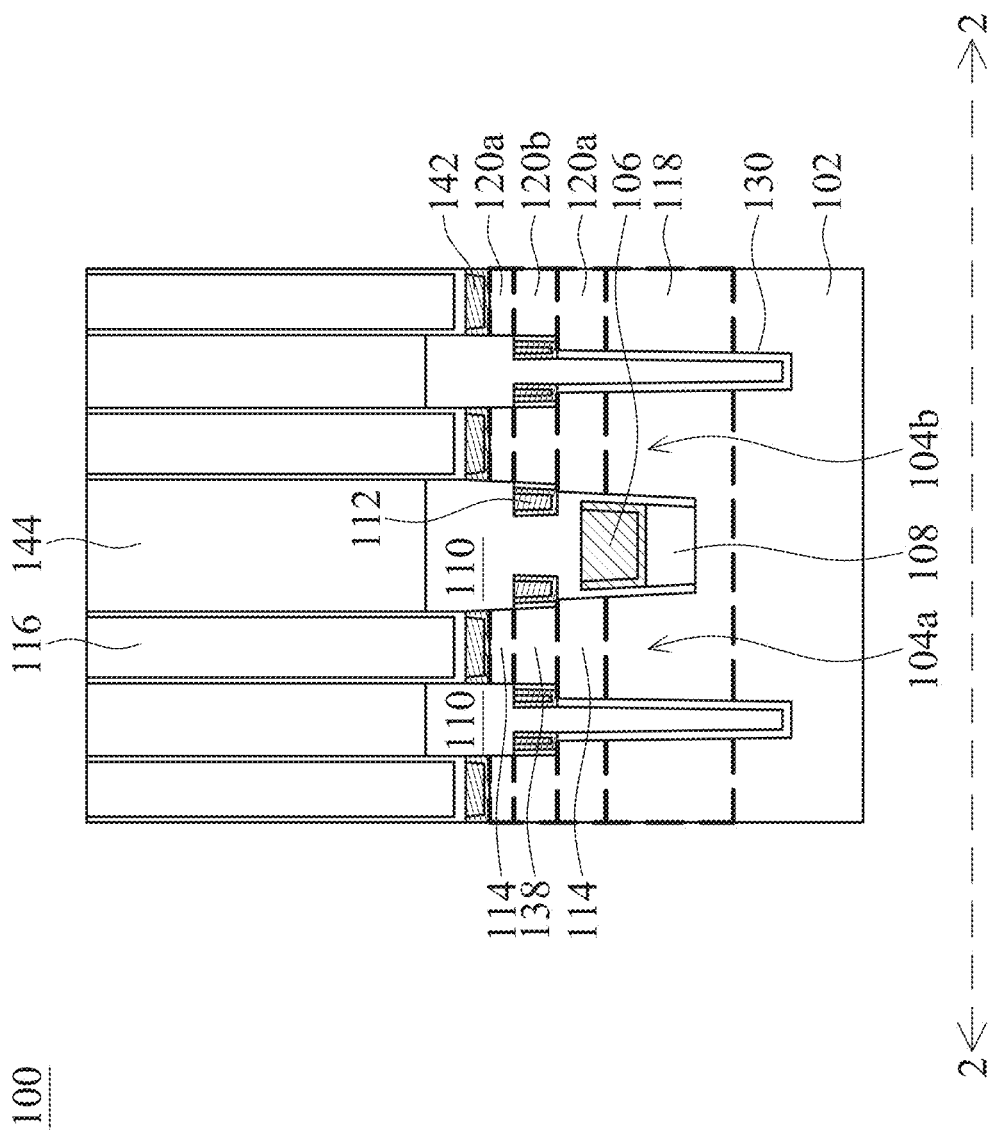
Figures 2, 2M:
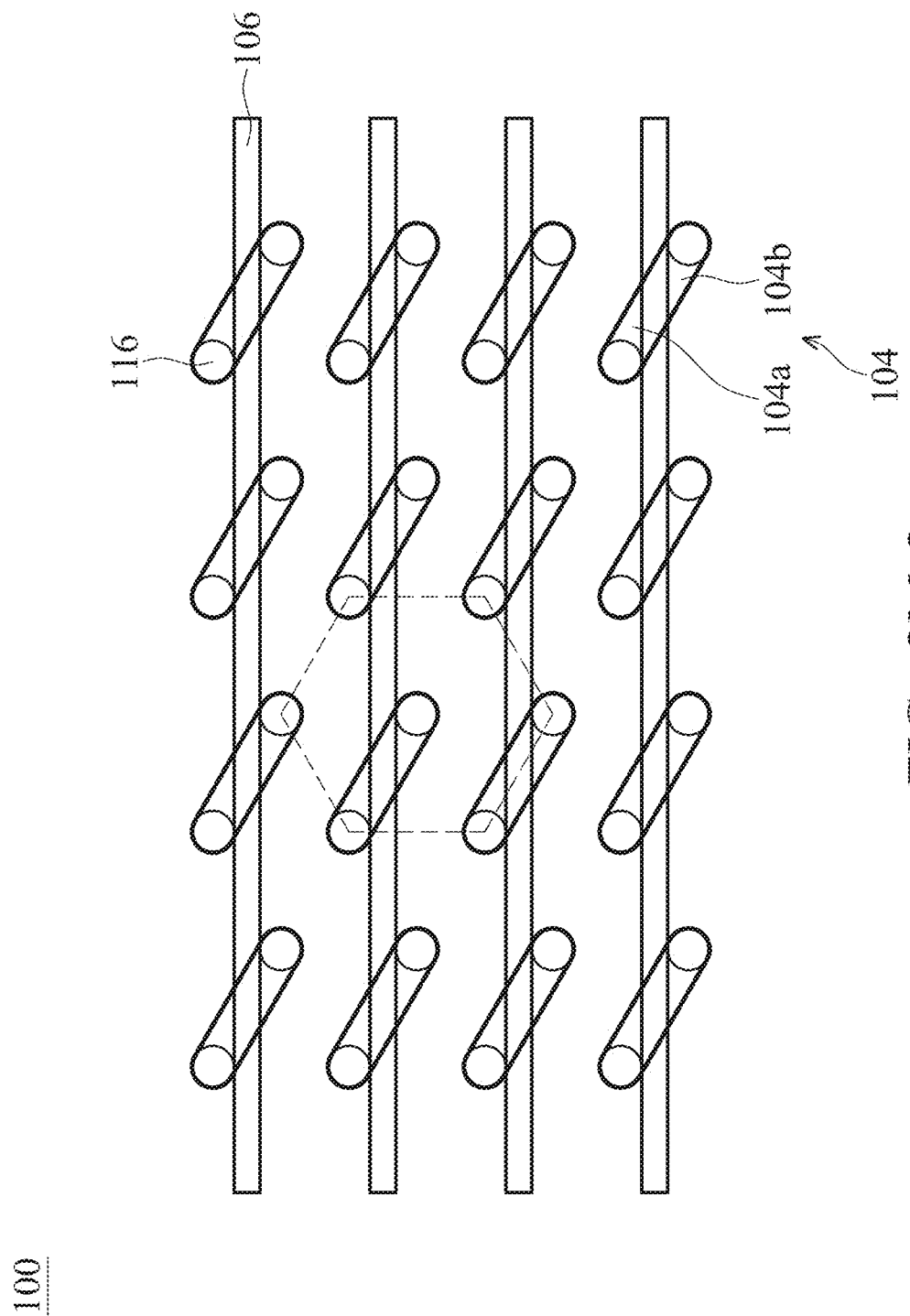

Next, as shown in FIG. 2M-1, a dielectric layer 144 is formed over the first active region 104a, the second active region 104b, and the isolation structure 110. Next, a trench is formed in the dielectric layer 144 by a patterning process such as a lithography and etching process (not shown). In some embodiments, the trench in the dielectric layer 144 is aligned with the contact 142.

Next, a capacitor 116 is formed at the trench in the dielectric layer 144. Therefore, the capacitor 116 is formed over the contact 142. The capacitor 116 may include the bottom electrode, the top electrode, and the dielectric sandwiched between them (not shown). The bottom electrode and the top electrode may include TiN, TaN, TiAlN, TiW, WN, Ti, Au, Ta, Ag, Cu, AlCu, Pt, W, Ru, Al, Ni, metal nitrides, other suitable electrode materials, or a combination thereof. The dielectric may include high dielectric constant dielectric material such as $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, or a combination thereof.

FIG. 2M-2 is a top view of the semiconductor memory structure 100 in FIG. 2M-1. As shown in FIG. 2M-2, the bit line 106 divides the active region 104 into the first active region 104a and the second active region 104b. The adjacent first active region 104a and the second active region 104b are arranged so that they are substantially parallel. The capacitor 116 is formed over the first active region 104a and the second active region 104b. In some embodiments as shown in FIG. 2M-1, the capacitor 116 is arranged in a honeycomb shape. In this way, the density of the capacitor 116 may increase.

As mentioned above, by separating the active region by a buried bit line, the leakage current between the word lines may be decreased. The Gate-all-around structure may increase the contact area of the word line and the channel region and decrease the sub-threshold leakage current caused by the short channel effect. The well region and the isolation structure below the bit line may decrease the leakage current between adjacent bit lines. The design in which the word line does not overlap the source/drain structure may decrease the gate-induced drain leakage current (GIDL). Lowering the leakage current may improve the loss of retention time. In addition, the contact above the active region may be self-aligned formed without extra masks and processing. The capacitor formed by this method may be arranged in a honeycomb shape, and the density of the capacitor may be increased.

Figure 3:
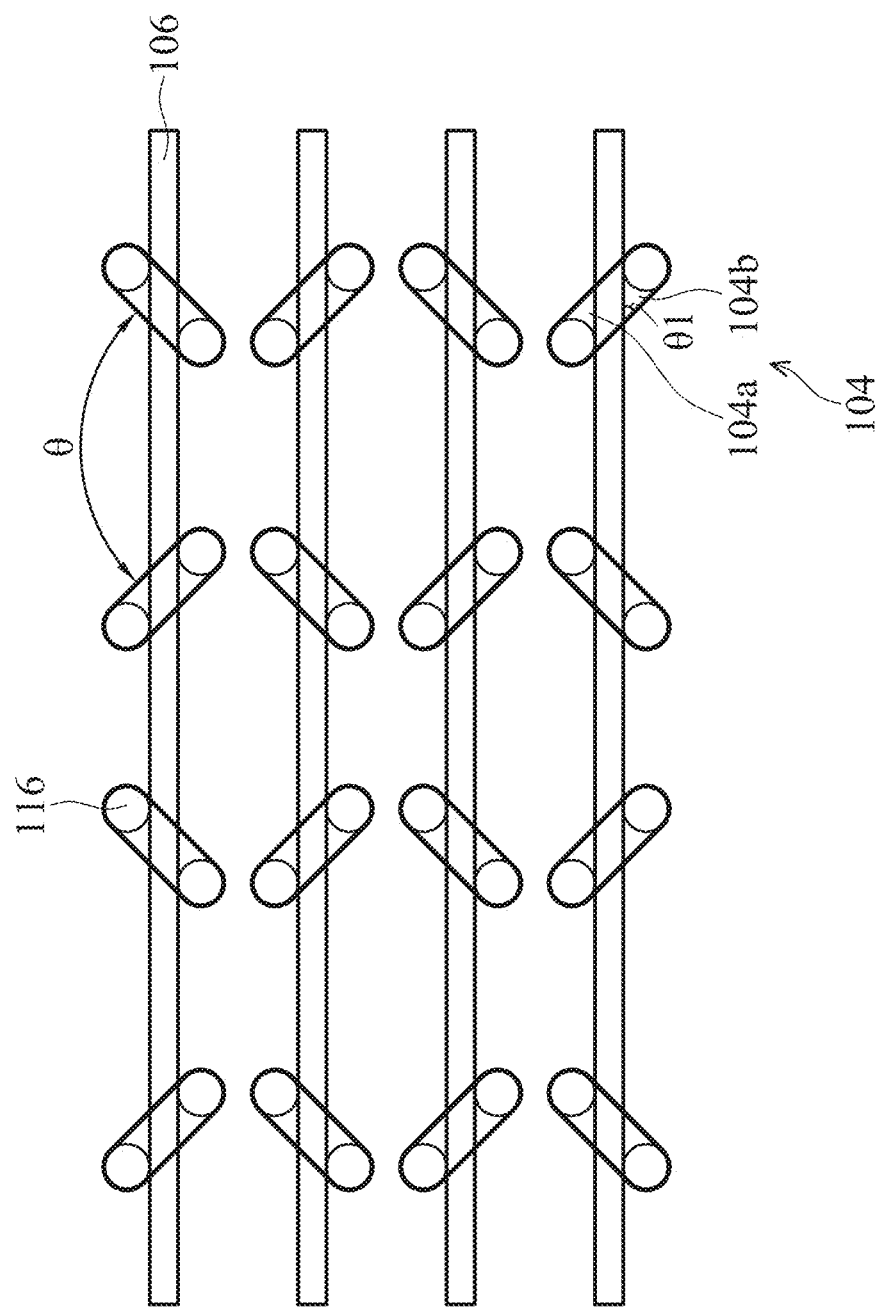
FIG. 3 is a top view of a semiconductor memory structure in accordance with some other embodiments.

FIG. 3 is a top view of a semiconductor memory structure 200 in accordance with some other embodiments. Some processes or devices are the same as, or similar to, those described in the embodiments above, and therefore the reference numerals and/or letters may be repeated. For the purpose of brevity, the descriptions of these processes and devices are not repeated herein. The difference from the embodiments described above is that, as shown in FIG. 3, the adjacent first active region 104a and the second active region 104b are arranged so that they are substantially perpendicular. That is, in some embodiments, the included angle θ between the adjacent first active region 104a and the second active region 104b is in a range of about 80 degrees to about 100 degrees. In other words, the included angle θ between the adjacent active regions 104 is in a range of about 80 degrees to about 100 degrees. In addition, in some embodiments, the included angle θ1 between the connecting line of the first active region 104a and the second active region 104b and the bit line is in a range of about 20 degrees to about 40 degrees.

By using the patterning process to define the pattern of the active region 104, and separating the active region 104 into the first active region 104a and the second active region 104b using the bit line 106, the distribution pattern of the capacitor 116 over the first active region 104a and the second active region 104b may be determined. In some embodiments as shown in FIG. 3, the line connecting the capacitor 116 is arranged to be perpendicular to each other. Therefore, different patterns for the active region 104 may be used, depending on the demands of process and design.

As mentioned above, by separating the active region by a buried bit line, the leakage current between the word lines may be decreased. The Gate-all-around structure may decrease the sub-threshold leakage current caused by the short channel effect. The well region and the isolation structure below the bit line may decrease the leakage current between adjacent bit lines. The design in which the word line does not overlap the source/drain structure may decrease the gate-induced drain leakage current (GIDL). Lowering the leakage current may improve the loss of retention time. In addition, the contact above the active region may be self-aligned formed without extra masks and processing. Different active region patterns may be used, depending on the demands of process and design, in order to form different capacitor arrangements.

What is claimed is:

1. A method for forming a semiconductor memory structure, comprising:
    forming an isolation structure surrounding an active region in a substrate;
    forming a first trench separating the active region into a first active region and a second active region;
    forming a bit line at a bottom portion of the first trench;
    forming a word line surrounding the first active region and the second active region, and over the bit line;
    forming a contact over the first active region and the second active region by a self-aligned deposition process; and
    forming a capacitor over the contact.

2. The method for forming a semiconductor memory structure as claimed in claim 1, further comprising:
    conformally forming a barrier layer over a sidewall and a bottom surface of the first trench after forming the first trench; and
    removing the barrier layer over the bottom surface of the first trench.

3. The method for forming a semiconductor memory structure as claimed in claim 1, further comprising:
    depositing a first semiconductor material layer over the bottom portion of the first trench; and
    forming the bit line over the semiconductor material layer in the trench.

4. The method for forming a semiconductor memory structure as claimed in claim 1, further comprising:
    filling the first trench with an isolation material after forming the bit line, wherein the isolation material and the isolation structure are made of the same material.

5. The method for forming a semiconductor memory structure as claimed in claim 4, further comprising:
    etching back the isolation material and the isolation structure to form a second trench surrounding the first active region and the second active region; and
    forming the word line in the second trench.

6. The method for forming a semiconductor memory structure as claimed in claim 5, wherein forming the word line comprises:
    forming a gate dielectric layer over a sidewall of the first active region and the second active region in the second trench;
    conformally forming a barrier layer in the second trench;
    filling the second trench with a conductive layer; and
    etching back the gate dielectric layer, the barrier layer, and the conductive layer to expose a top portion of the first active region and the second active region.

7. The method for forming a semiconductor memory structure as claimed in claim 5, further comprising:
    filling the second trench with the isolation material after forming the word line; and
    planarizing the isolation material to expose an upper surface of the first active region and the second active region.

8. The method for forming a semiconductor memory structure as claimed in claim 1, further comprising:
    etching back the first active region and the second active region to form a recess; and
    filling a conductive material in the recess to form the contact.

9. The method for forming a semiconductor memory structure as claimed in claim 1, further comprising:
   blanketly doping a lower portion of the first active region and the second active region to form a well region having a first conductivity type.

10. The method for forming a semiconductor memory structure as claimed in claim 1, further comprising:
   doping the first active region and the second active region so that the first active region and the second active region exposed from the word line have a first conductivity type, and the first active region and the second active region surrounded by the word line have a second conductivity type,
   wherein the first conductivity type and the second conductivity type are different.

11. A semiconductor memory structure, comprising:
   an isolation structure surrounding a first active region and a second active region disposed over a substrate;
   a bit line disposed below the isolation structure between the first active region and the second active region;
   a word line surrounding the first active region and the second active region and disposed over the bit line;
   a contact disposed over the first active region and the second active region and in direct contact with the first active region and the second active region; and
   a capacitor disposed over the contact,
   wherein a top surface of the first active region and a top surface of the second active region are lower than a top surface of the isolation structure.

12. The semiconductor memory structure as claimed in claim 11, wherein the first active region and the second active region further comprise:
   a channel region surrounded by the word line; and
   a pair of source/drain regions disposed over the channel region and under the channel region respectively,
   wherein the pair of source/drain regions has a first conductivity type, the channel region has a second conductivity type, and the first conductivity type is different from the second conductivity type.

13. The semiconductor memory structure as claimed in claim 12, wherein the contact is in direct contact with the pair of source/drain regions.

14. The semiconductor memory structure as claimed in claim 11, further comprising:
   a barrier layer disposed between the bit line and the first active region and the second active region, wherein the barrier layer and the isolation structure are made of the same material.

15. The semiconductor memory structure as claimed in claim 11, wherein a bottom surface of the contact is lower than the top surface of the isolation structure.

16. The semiconductor memory structure as claimed in claim 11, further comprising:
   a well region disposed at a lower portion of the first active region and the second active region, and partially disposed beneath the bit line; and
   a semiconductor material layer disposed between the well region and the bit line, and in direct contact with the well region and the bit line.

17. The semiconductor memory structure as claimed in claim 11, wherein the word line comprises:
   a gate dielectric layer formed over a sidewall of the first active region and the second active region;
   a barrier layer conformally formed over a surface of the first active region, the second active region, and the isolation structure; and
   a conductive layer disposed between the barrier layers.

18. The semiconductor memory structure as claimed in claim 11, wherein the first active region and the second active region are substantially arranged in parallel with the adjacent first active region and second active region in a top view.

19. The semiconductor memory structure as claimed in claim 11, wherein the capacitors are arranged in a honeycomb shape in a top view.

20. The semiconductor memory structure as claimed in claim 11, wherein the first active region and the second active region and the adjacent first active region and second active region are substantially perpendicularly arranged in a top view.

* * * * *